United States Patent
Nomura

(10) Patent No.: US 6,272,125 B1
(45) Date of Patent: Aug. 7, 2001

(54) GAIN COMPENSATING APPARATUS FOR USE WITH AMPLIFYING PORTION IN CODE DIVISION MULTIPLE ACCESS COMMUNICATION SYSTEM

(75) Inventor: Tominari Nomura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/104,373

(22) Filed: Jun. 25, 1998

(30) Foreign Application Priority Data

Jun. 27, 1997 (JP) .................................................. 9-172628

(51) Int. Cl.[7] .................................................. H04J 13/02
(52) U.S. Cl. .......................... 370/342; 370/441; 375/146
(58) Field of Search .................................... 370/335, 342, 370/441; 375/140, 141, 146

(56) References Cited

FOREIGN PATENT DOCUMENTS

| 7-221735 | 8/1995 | (JP) . |
|---|---|---|
| 8-37515 | 2/1996 | (JP) . |
| 8-70274 | 3/1996 | (JP) . |
| 8-139617 | 5/1996 | (JP) . |
| 8-195712 | 7/1996 | (JP) . |

*Primary Examiner*—Melvin Marcelo
(74) *Attorney, Agent, or Firm*—Sughrue, Mion, Zinn, Macpeak & Seas, PLLC

(57) ABSTRACT

A gain compensating apparatus for use with an amplifying portion corresponding to code division multiple access system is disclosed, that comprises a spreading/combining portion for outputting amplitude data that has been spread and quantized and transmission average value information, a D/A converting portion for outputting an analog base band signal, a modulating portion for outputting a modulation signal, a variable ATT portion for controlling the attenuation amount with a control signal and controlling the level of the modulation signal, an amplifying portion for amplifying a power, a HYB for branching an output signal of the amplifying portion, one output signal of the HYB being a transmission signal, a detecting portion for detecting an output signal of the HYB and outputting a detected signal, an A/D converting portion for converting the detected signal into quantized transmission power data, and a comparing/controlling portion for comparing the transmission power data with the transmission average value information, outputting data for compensating the difference, and controlling the variable ATT portion.

10 Claims, 6 Drawing Sheets

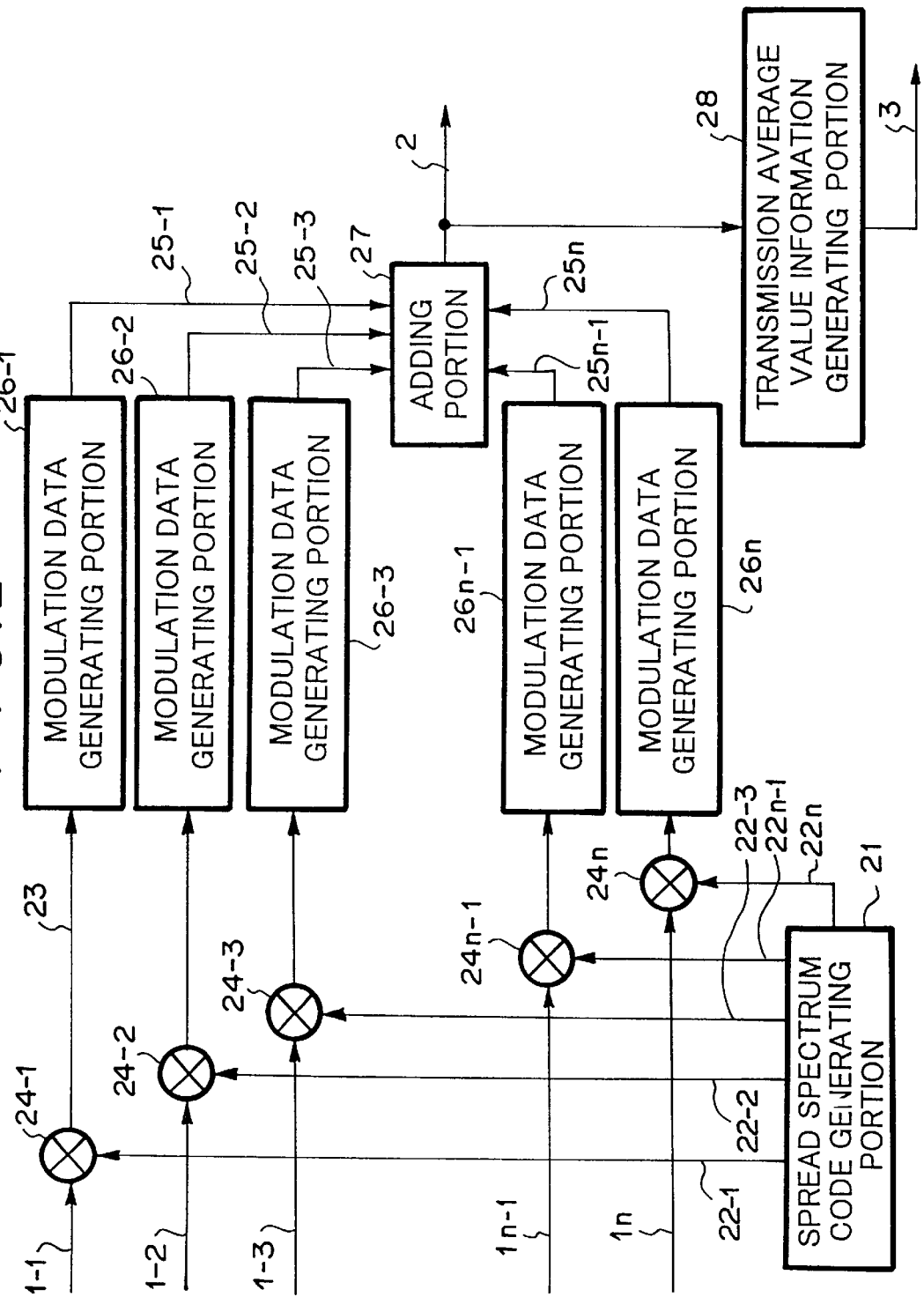

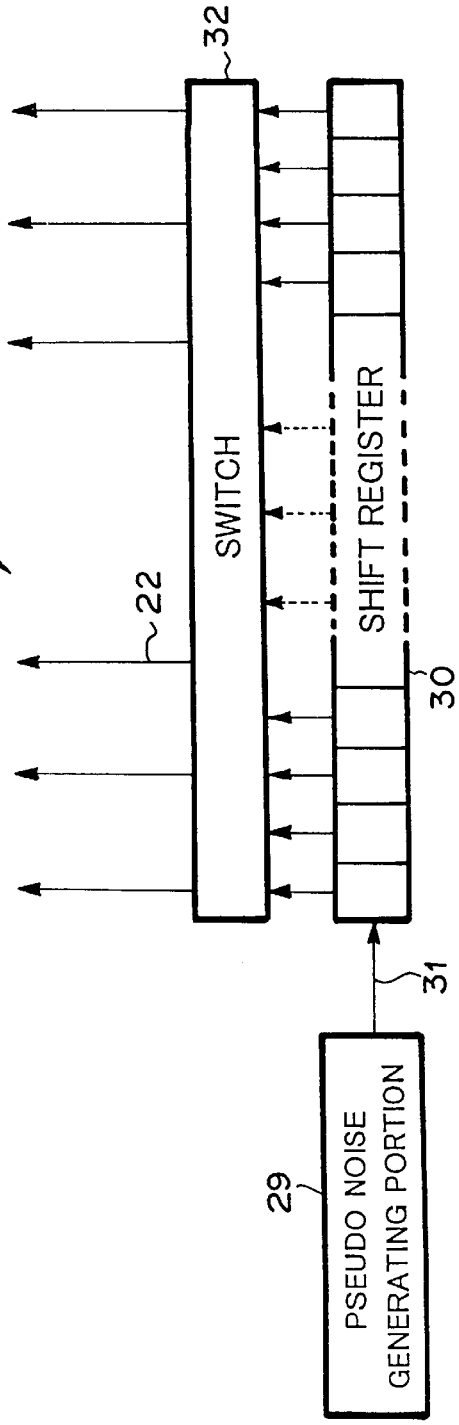
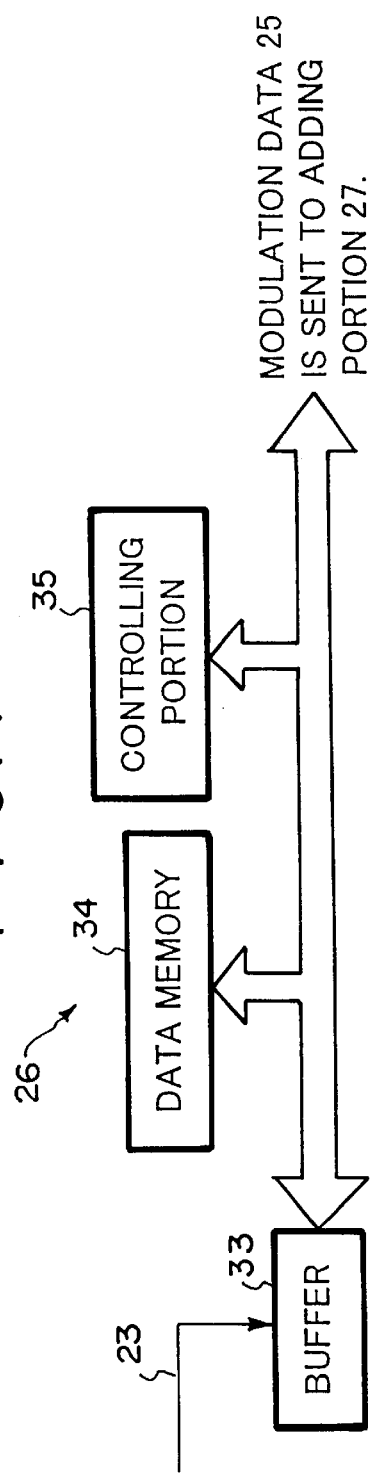

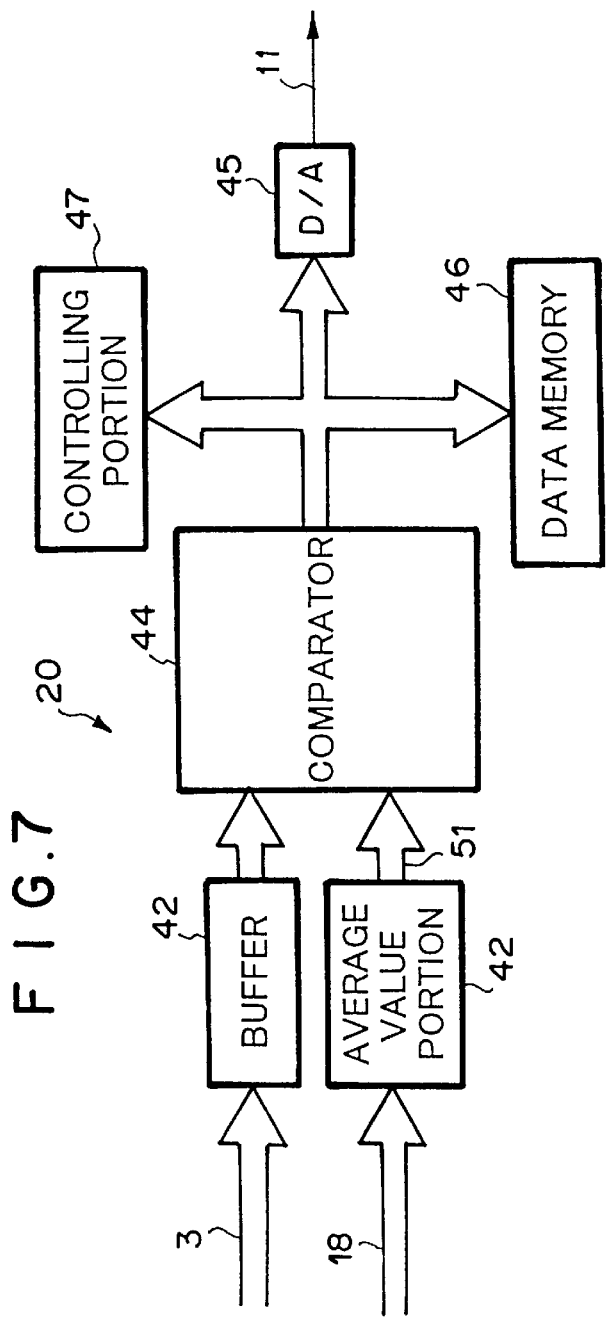
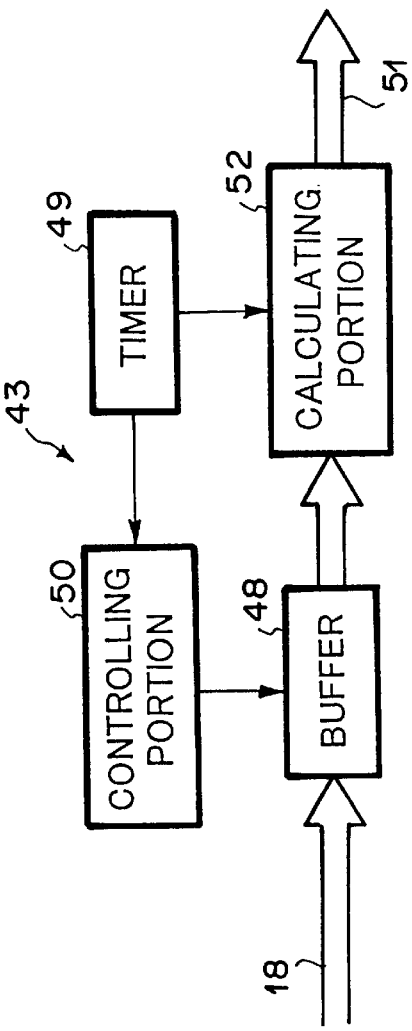

GAIN COMPENSATING APPARATUS FOR USE WITH AMPLIFYING PORTION IN CODE DIVISION MULTIPLE ACCESS COMMUNICATION SYSTEM

BACKGROUND OF THE INVENTION

1. Field of the Invention

The present invention relates to a code division multiple access communication system for assigning different spread spectrum codes that have high self correlation coefficients and much higher transmission rates than transmission data to individual transmission channels, directly multiplying the transmission data by spread spectrum data as the spread spectrum codes, directly spreading the transmission data to a wide band on the frequency axis, and multiplexing a plurality of channels to the same frequency band, in particular, to a gain compensating apparatus for use with an amplifying portion for compensating the gain of a power amplifying portion in a radio portion corresponding to transmission power information designated for stabilizing for example a cell radius of a mobile communication.

2. Description of the Related Art

As factors with respect to deterioration of the gain of a transmission amplifier, there are a temperature fluctuation and an aged tolerance. As countermeasures against the temperature fluctuation, for example, the following two systems are known. As a first system, a device whose characteristic varies depending on the temperature such as a thermistor is disposed in an objective circuit. As a second system, a transmission output signal is detected. The detected data is compared with a desired output signal and the gain of an amplifier is controlled with a variable gain amplifier or a variable attenuator disposed on a signal line so that the voltage of the detected data matches the voltage of the desired output signal.

In the second system, the deterioration of the gain due to the aged tolerance can be also compensated. A technology for compensating the gain of a transmitting portion has been disclosed as Japanese Patent Laid-Open Publication No. 8-139617, titled "Transmission Output Signal Controlling Circuit for use with AME Transmitter (translated title)", by Yasutaka et al. In this related art reference, the fluctuation of the gain of the amplifier in the AME transmitter is suppressed against fluctuations of frequency and temperature thereof so as to always accomplish the maximum modulation factor of 100%. As means for accomplishing such an object, the level of a local oscillation signal generated for converting a modulation signal into a transmission frequency signal is compared with the level of the transmission output signal and the difference is fed back so as to adjust the gain of the amplifier. In the related art reference, a stable oscillation signal is required in any condition and in any environment.

Thus, as with the code division multiple access communication system, when the level of the modulation signal that is input to the amplifying portion fluctuates depending on the number of multiplexed transmission channels, there is no means for varying a gain control condition. In addition, to distinguish the cause of the fluctuation of the gain from the fluctuation of the transmission output signal corresponding to the fluctuation of the number of multiplexed transmission channels, the fluctuation of the power in the case that the power of each transmission channel is independently controlled, the environmental fluctuation of the transmission amplifier, and the aged tolerance thereof, information of a power to be currently transmitted should be obtained. However, to obtain information necessary for compensating the gain, data should be exchanged with so-called host units such as a central monitoring/controlling portion and a signal generating block of each transmission channel.

The above-described related art reference has the following four problems. As the first problem, since a highly stable local oscillation signal source is used for a reference signal, the level of the local oscillation signal, the level of the signal that is input to a comparator, the level of the output signal of the comparator, and so forth cannot be varied against the information of the transmission power. Thus, the gain of the amplifier according to the code division multiple access communication system cannot be compensated.

As the second problem, there are a plurality of transmission channels per RF carrier at a time. In addition, powers of individual transmission channels are independently controlled. Thus, to allow the amplifying portion to control the gain thereof, it should obtain the power to be currently transmitted. As means for obtaining the transmission power, information such as the number of transmission channels and power control state of each transmission channel may be obtained from such host units. In this system, when power control intervals are short, the gain control does not follow the power control.

As the third problem, in the case that to solve the second problem, a storing device may be disposed in the gain compensating circuit and thereby information received from the host units are stored for a predetermined time period so as to decrease the delay of the control. However, as with the second problem, since the process speed is restricted, when the power control period intervals are short, the gain control does not follow the power control.

As the fourth problem, since the host units should inform the radio portion of a power to be transmitted per RF carrier to the radio portion, a dedicated gain compensating circuit is required. Thus, the scale of the apparatus becomes large. In addition, the dedicated gain compensating circuit and many circuits should be connected and thereby the number of connections becomes large.

SUMMARY OF THE INVENTION

An object of the present invention is to provide a gain compensating apparatus for use with an amplifying portion corresponding to code division multiple access (CDMA) communication system that cumulates data that has just been input to a transmission amplifying portion for a predetermined time period, obtains an average input amplitude, and controls and compensates the gain of an amplifying portion corresponding to the correlation between the average input amplification and the average output power of the transmission amplifier output signal so as to compensate the gain of the amplifying portion against the fluctuation of the temperature and aged tolerance of the amplifying portion rather than collect information of individual transmission channels.

The present invention is a gain compensating apparatus for use with a amplifying portion corresponding to direct sequence code division multiple access system for directly multiplying spread spectrum codes by transmission data, spreading the resultant data on the frequency axis, and multiplexing a plurality of transmission channels on the same frequency band, comprising a spreading/combining portion for inputting a plurality of transmission data, multiplying the transmission data by different spread spectrum codes, spreading the transmission data, generating spread spectrum data, converting the spread spectrum data into modulation data on the base band, adding the modulation data of individual transmission channels, multiplexing the modulation data, generating a multiplexed signal, obtaining quantized amplitude data, cumulating the amplitude data for a predetermined time period, and obtaining transmission average value information, a D/A converting portion for inputting the amplitude data from the spreading/combining portion and converting the amplitude data into an analog base band signal, a modulating portion, having a local oscillating portion and a modulator, for inputting the base band signal as a first input signal and a carrier generated by the local oscillating portion as a second input signal and outputs a modulation signal, a variable ATT portion for inputting the modulation signal, controlling an attenuation amount corresponding to a control signal, and controlling the level of the transmission output signal, an amplifying portion for inputting the modulation signal of which the level of the transmission power has been controlled by the variable ATT portion and amplifying the modulation signal, an HYB (distributor) for branching the output signal of the amplifying portion, the output signal of the HYB being sent to the outside of the apparatus as a transmission output signal, a detecting portion for detecting the output signal of the HYB and outputting a detected signal as voltage information, an A/D converting portion for quantizing the detected signal and converting the detected signal into digital transmission power data, and a comparing/controlling portion for inputting the transmission average value information received from the spreading/combining portion as a first input signal and the transmission power data received from the A/D converting portion as a second input signal, cumulating the transmission power data for a predetermined time period, comparing the cumulated signal with the transmission average value information, outputting data for compensating the difference as the compared result, and generating the control signal for controlling the variable ATT portion.

The spreading/combining portion assigns different spread spectrum codes to a plurality of transmission channels.

The spreading/combining portion cumulates in a predetermined time period the amplitude data of which the spread spectrum data of the individual transmission channels have been multiplexed and obtains average amplitude data.

The comparing/controlling portion cumulates the transmission power data received from the A/D converting portion in a predetermined time period and obtains average transmission power data.

The comparing/controlling portion, having a first means for obtaining information of a transmission power to be output by the amplifying portion corresponding to the average amplitude data and a second means for obtaining information of a transmission power that is actually output by the amplifying portion corresponding to the average transmission power data, for comparing the information of the first means with the information of the second means, obtaining the difference thereof, outputting the control signal for minimizing the difference, and controlling the variable ATT.

According to the present invention, the number of multiplexed transmission channels per carrier and power control information of each transmission channel are not obtained from host units. Instead, amplification data of a signal that is currently transmitted and that is input to an amplifying portion is cumulated for a predetermined time period and the average value thereof is obtained. In addition, the average value of a transmission power that is output from the amplifying portion in the predetermined time period is obtained. With the difference of these average values, the gain of the amplifying portion is controlled. Thus, in such a simple structure, the gain of the amplifying portion corresponding to the code division multiple access communication system can be compensated.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 2 is a schematic diagram showing the structure of a spreading/combining portion of the apparatus shown in FIG. 1 according to the present invention;

FIG. 3 is a schematic diagram showing the structure of a spread spectrum code generating portion of the spreading/combining portion shown in FIG. 2 according to the present invention;

FIG. 4 is a schematic diagram showing the structure of a modulation data generating portion of the spreading/combining portion shown in FIG. 2 according to the present invention;

FIG. 7 is a schematic diagram showing the structure of a comparing/controlling portion of the apparatus shown in FIG. 1 according to the present invention;

FIG. 8 is a block diagram showing the structure of an average value portion of the comparing/controlling portion shown in FIG. 7 according to the present invention.

DESCRIPTION OF PREFERRED EMBODIMENT

Figure 1:
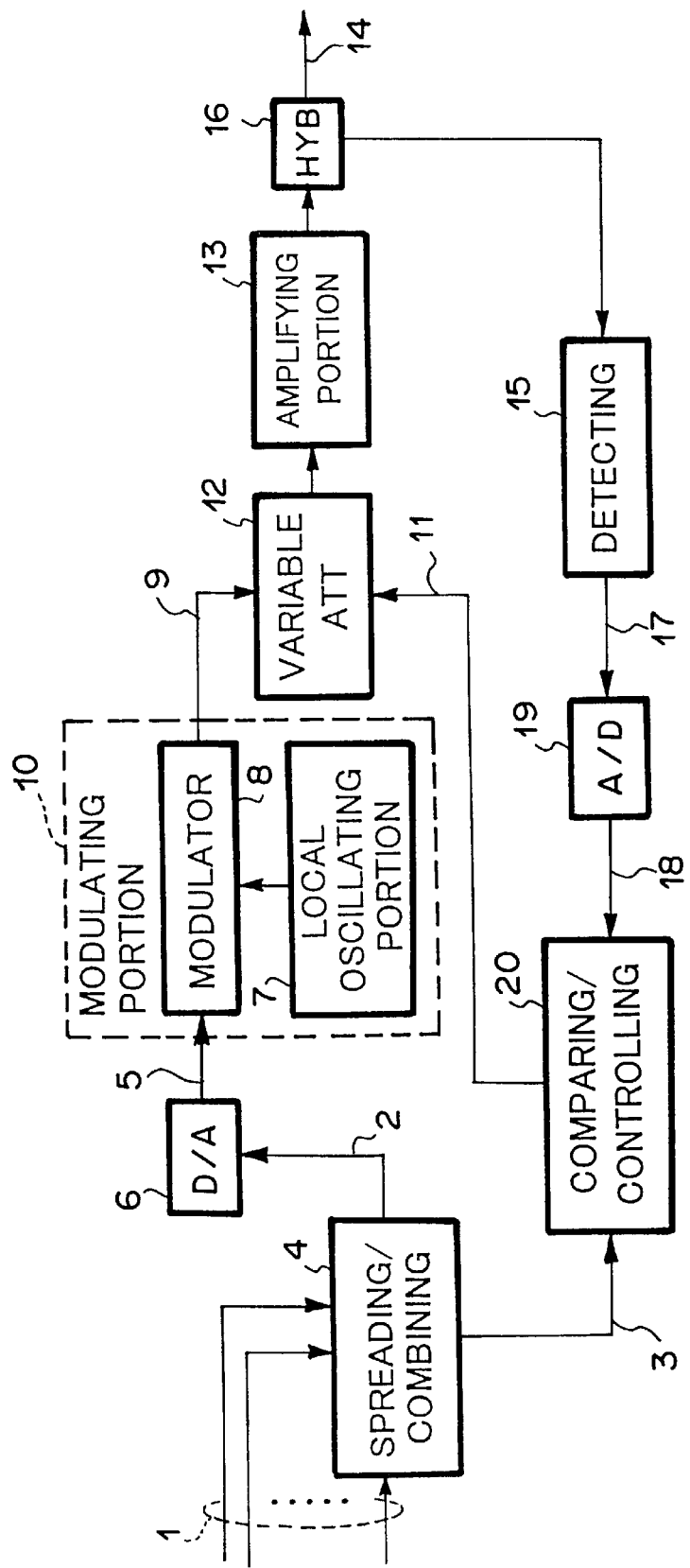
FIG. 1 is a block diagram showing a gain compensating apparatus for use with an amplifying portion according to an embodiment of the present invention.

Next, with reference to the accompanying drawings, an embodiment of the present invention will be described. A direct sequence code division multiple access apparatus (DS-CDMA) directly multiplies spread spectrum codes by transmission data, spreads the resultant data on the frequency axis, and multiplexes a plurality of transmission channels on the same frequency band. As shown in FIG. 1, the apparatus comprises a spreading/combining portion 4, a D/A converting portion 6, a modulating portion 10, a variable ATT portion 12, an amplifying portion 13, an HYB (distributor) 16, a detecting portion 15, an A/D converting portion 19, and a comparing/controlling portion 20. The spreading/combining portion 4 inputs a plurality of transmission data 1, multiplies the transmission data 1 by different spread spectrum codes, spreads the transmission data 1, generates spread spectrum data, converts the spread spectrum data into modulation data on the base band, adds the modulation data of individual transmission channels, multiplexes the modulation data, generates a multiplexed signal, obtains quantized amplitude data, cumulates the amplitude data 2 for a predetermined time period, and obtains transmission average value information 3. The D/A converting portion 6 inputs the amplitude data 2 from the spreading/combining portion 4 and converts the amplitude data 2 into an analog base band signal 5. The modulating portion 10 has a local oscillating portion 7 and a modulator 8. The modulating portion 10 inputs the base band signal 5 as a first input signal and a carrier generated by the local oscillating portion 7 as a second input signal and outputs a modulation signal 9. The variable ATT portion 12 inputs the modulation signal 9, controls an attenuation amount corresponding to a control signal 11 (that will be described later), and controls the level of the transmission output signal. The amplifying portion 13 inputs the modulation signal 9 of which the level of the transmission power has been controlled by the variable ATT portion 12 and amplifies the modulation signal 9. The HYB 16 branches the output signal of the amplifying portion 13 to the outside of the apparatus as a transmission output signal 14 and the detecting portion 15. The detecting portion 15 detects the output signal of the HYB 16 and outputs a detected signal 17 as voltage information. The A/D converting portion 19 quantizes the detected signal 17 and converts the detected signal 17 into digital transmission power data. The comparing/controlling portion 20 inputs the transmission average value information 3 received from the spreading/combining portion 4 as a first input signal and the transmission power data 18 received from the A/D converting portion 19 as a second input signal, cumulates the transmission power data 18 for a predetermined time period, compares the cumulated signal with the transmission average value information 3, outputs data for compensating the difference as the compared result, and generates the control signal 11 for controlling the variable ATT portion 12.

Next, with reference to FIG. 2, the structure of the spreading/combining portion 4 will be described in detail. FIG. 2 shows the structure of the spreading/combining portion 4. The spreading/combining portion 4 comprises multiplying portions 24 (24-1, 24-2, 24-3, . . . 24-(n−1), 24-n), modulation data generating portions 26 (26-1, 26-2, 26-3, . . . , 26-(n−1), and 26-n), an adding portion 27, and a transmission average value information generating portion 28. Each of the multiplying portions 24 inputs the transmission data 1 of the relevant transmission channel as a first input signal and the spread spectrum code 22 with a much higher data rate than the transmission data as a second input signal, the spread spectrum code being generated by the spread spectrum code generating portion 21, and outputs the spread spectrum code 23 of which the transmission data 1 has been spread. Each of the modulation data generating portions 26 inputs the spread spectrum data 23, converts the spread spectrum data 23 into the modulation data 25 that designates an amplitude at a particular time point on the base band, and outputs the modulation data 25. The adding portion 27 adds the modulation data of each channel and outputs the amplitude data 2. The transmission average value information generating portion 28 inputs the amplitude data 2, cumulates the amplitude data in a predetermined time period, calculates the transmission average value information 3, and outputs the transmission average value information 3.

Next, with reference to FIG. 3, the structure of the spread spectrum code generating portion 21 will be described in detail. FIG. 3 shows the structure of the spread spectrum code generating portion 21. The spread spectrum code generating portion 21 comprises a pseudo noise generating portion 29 and a shift register 30. The pseudo noise generating portion 29 generates a pseudo noise code 31 that has high self correlation coefficient and periodicity. The pseudo noise code 31 is for example an M sequence code or Gold code. Such a code can be easily generated with a delay device and an exclusive-OR device. The shift register 30 delays the pseudo noise code 31 and outputs a plurality of spread spectrum codes 22 that correspond to the number of transmission channels at the same generation timing. The spread spectrum code generating portion 21 further comprises a switch 32 that selects the spread spectrum codes 22 to be sent to the respective transmission channels.

Next, the operation of each of the multiplying portions 24 will be described. The multiplying portion 24 multiplies the transmission data 1 as a first input signal by the spread spectrum code 22 as a second input signal. The multiplying portion 24 can be easily composed of an AND device.

Next, with reference to FIG. 4, the structure of the modulation data generating portion 26 will be described in detail. FIG. 4 shows the structure of the modulation data generating portion 26. The modulation data generating portion 26 comprises a buffer 33, a data memory 34, and a controlling portion 35. The buffer 33 stores the spread spectrum data 23. The data memory 34 stores modulation locus data corresponding to the variation of the spread spectrum data 23. The controlling portion 35 controls the buffer 33 and the data memory 34, calculates data read from the data memory 34 with the power control information included in the transmission data 1, and outputs the modulation data 25 to the adding portion 27.

Figure 5:
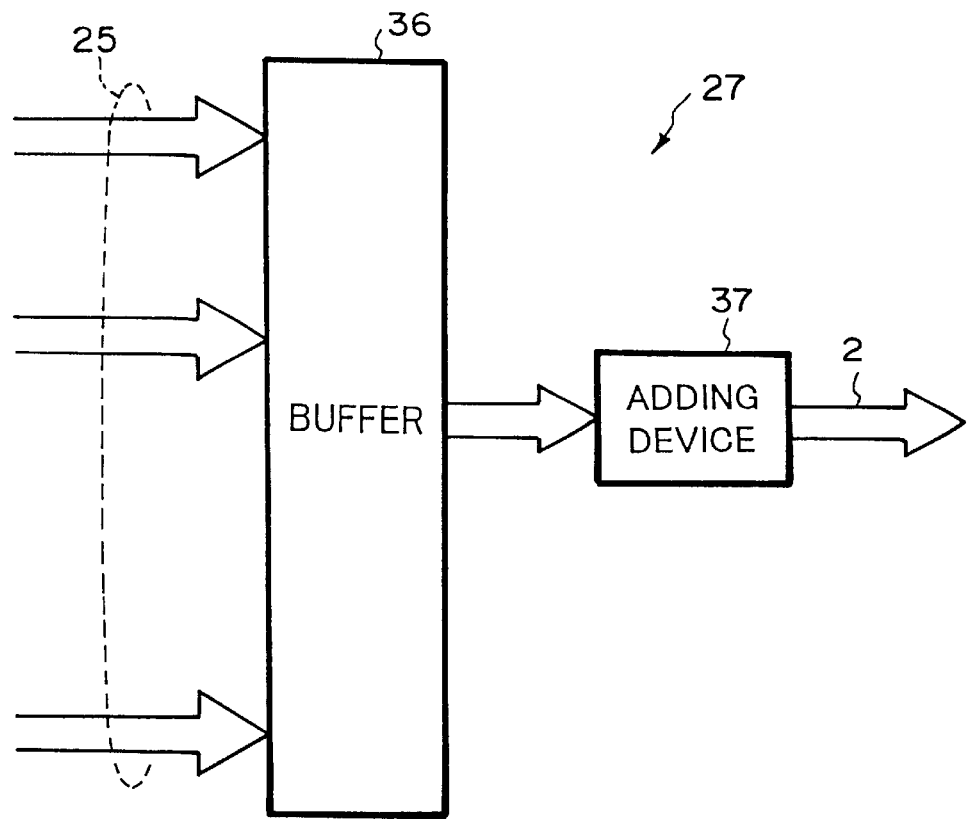
FIG. 5 is a schematic diagram showing the structure of an adding portion of the spreading/combining portion shown in FIG. 2 according to the present invention.

Next, with reference to FIG. 5, the structure of the adding portion 27 will be described in detail. FIG. 5 shows the structure of the adding portion 27. The adding portion 27 comprises a buffer 36 and an adding device 37. The buffer 36 stores the modulation data 25 of each transmission channel. The adding device 37 inputs the modulation data 25 of each transmission channel stored in the buffer 36, adds the modulation data 25, and outputs the amplitude data 2.

Figure 6:
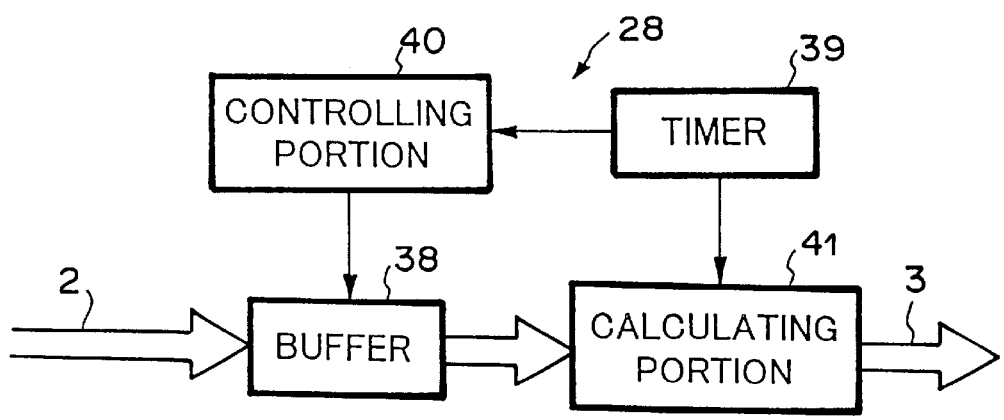
FIG. 6 is a schematic diagram showing the structure of a transmission average value information generating portion of the spreading/combining portion shown in FIG. 2 according to the present invention.

Next, with reference to FIG. 6, the structure of the transmission average value information generating portion 28 will be described in detail. FIG. 6 shows the structure of the transmission average value information generating portion 28. The transmission average value information generating portion 28 comprises a buffer 38, a timer 39, a controlling portion 40, and a calculating portion 41. The buffer 38 stores the amplitude data 2. The timer 39 counts a predetermined time period. The controlling portion 40 controls the timing of the buffer 38 in association with the timer 39. The calculating portion 41 cumulates the amplitude data 2 in a predetermined time period in association with the timer 39 and calculates the average value thereof.

Next, with reference to FIG. 7, the structure of the comparing/controlling portion 20 will be described in detail. FIG. 7 shows the structure of the comparing/controlling portion 20. The comparing/controlling portion 20 comprises a buffer 42, an average value portion 43, a comparator 44, a data memory 46, and a controlling portion 47. The buffer 42 stores the transmission average value information 3. The average value portion 43 stores the transmission power data 18. The comparator 44 compares the average value information 3 stored in the buffer 42 with the transmission power data 18 stored in the average value portion 43, the timing of the average value information 3 synchronizing with the timing of the transmission power data 18. The data memory 46 stores the amplitude data to be sent to the D/A 45 corresponding to the output signal of the comparator 44. The controlling portion 47 controls the flow of data.

Next, with reference to FIG. 8, the structure of the average value portion 43 will be described in detail. FIG. 8 shows the structure of the average value portion 43. The average value portion 43 comprises a buffer 48, a timer 49, a controlling portion 50, and a calculating portion 52. The buffer 48 stores the transmission power data 18. The timer 49 counts a predetermined time period. The controlling portion 50 controls the timing of the buffer 48 in association with the timer 49. The calculating portion 52 cumulates the transmission power data 18 for a predetermined time period in association with the timer 49, calculates the average value, and outputs the average transmission power data 51.

Next, with reference to FIGS. 2 to 7, the operation of the code division multiple access (CDMA) apparatus that multiplexes codes to the same frequency band according to the present invention will be described. Transmission data 1—1 to 1-n of individual transmission channels are input to the spread/combining portion 4. The structure of the spreading/combining portion 4 is shown in FIG. 2. The multipliers 24 multiply the input transmission data 1 of individual transmission channels by the relevant spread spectrum codes 22 and generate the spread spectrum data 23. The spread spectrum code 22 is generated by the spread spectrum code generating portion 21. The transmission rate of the spread spectrum code 22 is as high as around 10 times or more the data rate of the transmission data. A spread spectrum code is a pseudo noise code with periodicity such as an M sequence code. To accomplish the code division multiple access operation, different codes corresponding to the number of transmission channels should be provided. According to the embodiment of the present invention, with the shift register 30, a plurality of different spread spectrum codes are generated at a time. The spread spectrum data 23 corresponding to the relevant transmission data 1 is input to the modulation data generating portion 26 corresponding to the transmission data 1. The modulation data generating portion 26 modulates the spread spectrum data 23 and outputs the modulation data 25 that is amplitude information in a predetermined time period Δt. The predetermined time period Δt depends on the sampling theorem.

The modulation data 25 obtained from the transmission data 1 of each transmission channel is added by the adding portion 27. The adding portion 27 generates the amplitude data 2 including the amplitude information of all the transmission channels. The adding process is synchronously performed at the time period Δt so as to maintain the orthogonality of each transmission channel. The transmission average value information generating portion 28 in the spreading/combining portion 4 obtains an average amplitude value in a predetermined time period and outputs the average amplitude value as the transmission average value information 3.

The structure of the transmission average value information generating portion 28 is shown in FIG. 6. The transmission average value information 3 is obtained in such a manner that the amplitude data 2 is stored in the buffer 38 for a time period corresponding to the timer 39 and the resultant amplitude data 2 is integrated by the calculating portion 41. The transmission average value information 3 is used in the comparing/controlling portion 20. The amplitude data 2 that is output from the spreading/combining portion 4 is sent to the D/A converting portion 6. The D/A converting portion 6 converts the amplitude data 2 as a digital signal into the base band signal 5 as an analog signal. The modulator 8 in the modulating portion 10 mixes the base band signal 5 and the local signal generated by the local oscillating portion 7 in the modulating portion 10 and outputs the resultant signal as the modulation signal 9. The modulation signal 9 is input to the variable ATT portion 12 that varies the attenuation amount corresponding to the control signal 11. The level of the modulation signal 9 is controlled by the variable ATT portion 12. The resultant signal is input to the amplifying portion 13. The amplifying portion 13 amplifies the modulation signal 9 whose level has been controlled. The resultant modulation signal 9 is sent to the HYB 16. The HYB 16 branches the modulation signal 9 to the transmission output signal 14 and the output signal to the detecting portion 15. The detecting portion 15 detects the input signal with for example an envelope detecting means and outputs the detected signal 17. The detected signal 17 is sent to the A/D converting portion 19. The A/D converting portion 19 converts the detected signal as an analog signal into the transmission power data 18 as a digital signal.

Figure 9:
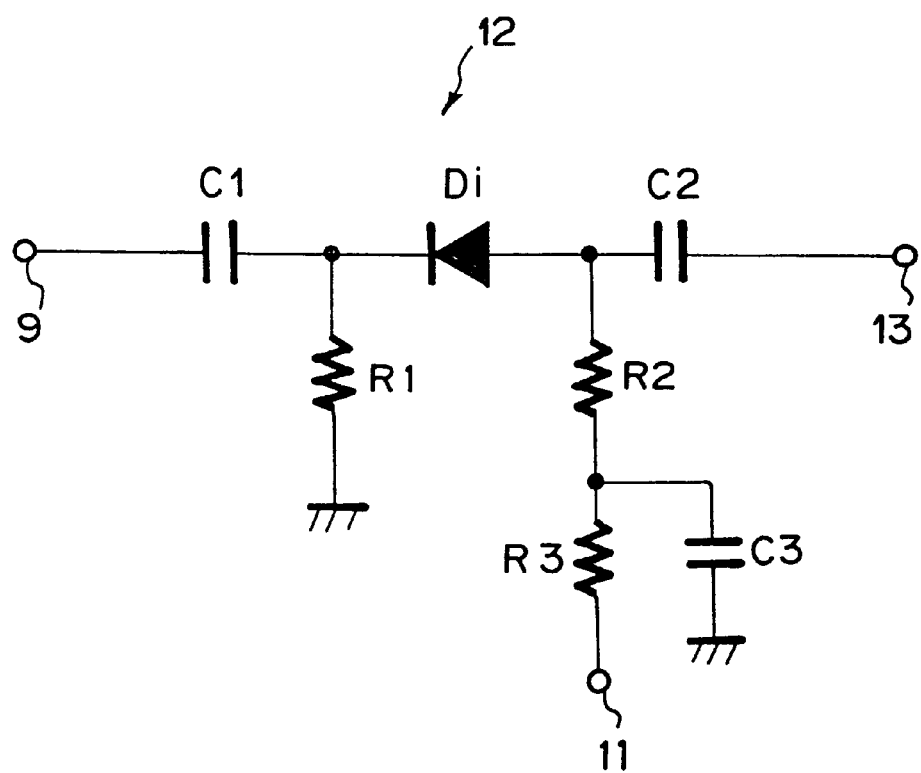
FIG. 9 is a schematic diagram showing the structure of a variable ATT portion of the apparatus shown in FIG. 1 according to the present invention.

The comparing/controlling portion 20 inputs the transmission power data 18 and the transmission average value information 3, detects the difference Δp thereof, and outputs the control signal 11 for controlling the attenuation amount of the variable ATT portion 12 so that the difference Δp becomes minimum. Next, with reference to FIG. 7, the operation of the comparing/controlling portion 20 will be described. The transmission average value information 3 is input to the buffer 42 so that the timing of the transmission average value information 3 synchronizes with the average value portion 43. The transmission power data 18 is input to the average value portion 43. The structure of the average value portion 43 is shown in FIG. 8. The input transmission power data 18 is stored in the buffer 48 for a time period corresponding to the timer 49. The transmission power data 18 is integrated by the calculating portion 52 and thereby the average transmission power data 51 is obtained. The transmission average value information 3 and the average transmission power data 51 are input to the comparator 44. The comparator 44 outputs the difference Δp. The controlling portion 47 selects from the data memory 47 data to be output to the D/A converting portion 45 corresponding to the difference Δp. The selected data is sent to the D/A converter 45. The D/A converter 45 converts the obtained data as a digital signal into the control signal 11 as an analog signal. As shown in FIG. 9, the variable ATT 12 comprises DC cut capacitors C1 and C2, resistors R1, R2, and R3, and a PIN diode Di. The variable ATT 12 varies the attenuation amount of the modulation signal 9 corresponding to the input level of the control signal 11 and outputs the resultant signal to the amplifier 13.

Next, the overall operation of the code division multiple access (CDMA) apparatus that multiplexes codes to the same frequency band will be described in brief. The transmission average value information 3 that is voltage average value information of the signal that is input to the radio portion is compared with the transmission power data 18 that is the average power value and thereby the difference Δp is obtained. The attenuation amount of the variable ATT portion 12 is controlled so that the difference Δp becomes minimum. Thus, the gain of the amplifying portion 13 is compensated. In addition, a plurality of transmission channels that have been multiplexed in the same frequency band is integrally amplified and output as the transmission signal 14.

According to the present invention, as a first effect, since a highly stable local oscillation signal source is not used for a reference signal unlike with the related art reference, transmission power information that fluctuates time by time can be flexibly handled. Thus, the gain of the amplifying portion corresponding to the code division multiple access system can be accomplished.

In addition, according to the present invention, as a second effect, without need to obtain information such as the number of multiplexed transmission channels per RF carrier, amplitude information of each transmission channel, and power control information of each transmission channel from so-called host units such as a central controlling portion and a signal generating block of each transmission channel, the amplifying portion can compensate the gain thereof.

According to the present invention, as a third effect, since it is not necessary to communicate with the so-called host units such as the central controlling portion and the signal generating block of each transmission block, the amplifying portion can self-compensate the gain thereof at high speed.

According to the present invention, as described above, since the central controlling portion and the signal generating block of each transmission channel do not require gain compensating circuits and the connections to the radio portion, the structure of the apparatus can be simplified.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A gain compensating apparatus for use with a amplifying portion corresponding to direct sequence code division multiple access system for directly multiplying spread spectrum codes by transmission data, spreading the resultant data on the frequency axis, and multiplexing a plurality of transmission channels on the same frequency band, comprising:

a spreading/combining portion for inputting a plurality of transmission data, multiplying the transmission data by different spread spectrum codes, spreading the transmission data, generating spread spectrum data, converting the spread spectrum data into modulation data on the base band, adding the modulation data of individual transmission channels, multiplexing the modulation data, generating a multiplexed signal, obtaining quantized amplitude data, cumulating the amplitude data for a predetermined time period, and obtaining transmission average value information;

a D/A converting portion for inputting the amplitude data from said spreading/combining portion and converting the amplitude data into an analog base band signal;

a modulating portion, having a local oscillating portion and a modulator, for inputting the base band signal as a first input signal and a carrier generated by the local oscillating portion as a second input signal and outputs a modulation signal;

a variable ATT portion for inputting the modulation signal, controlling an attenuation amount corresponding to a control signal, and controlling the level of the transmission output signal;

an amplifying portion for inputting the modulation signal of which the level of the transmission power has been controlled by said variable ATT portion and amplifying the modulation signal;

an HYB (distributor) for branching the output signal of said amplifying portion, the output signal of said HYB being sent to the outside of the apparatus as a transmission output signal;

a detecting portion for detecting the output signal of said HYB and outputting a detected signal as voltage information;

an A/D converting portion for quantizing the detected signal and converting the detected signal into digital transmission power data; and a comparing/controlling portion for inputting the transmission average value information received from said spreading/combining portion as a first input signal and the transmission power data received from said A/D converting portion as a second input signal, cumulating the transmission power data for a predetermined time period, comparing the cumulated signal with the transmission average value information, outputting data for compensating the difference as the compared result, and generating the control signal for controlling said variable ATT portion.

2. The gain compensating apparatus as set forth in claim 1, wherein said spreading/combining portion assigns different spread spectrum codes to a plurality of transmission channels.

3. The gain compensating apparatus as set forth in claim 1, wherein said spreading/combining portion cumulates in a predetermined time period the amplitude data of which the spread spectrum data of the individual transmission channels have been multiplexed and obtains average amplitude data.

4. The gain compensating apparatus as set forth in claim 1, wherein said comparing/controlling portion cumulates the transmission power data received from said A/D converting portion in a predetermined time period and obtains average transmission power data.

5. The gain compensating apparatus as set forth in claim 1, wherein said comparing/controlling portion, having first means for obtaining information of a transmission power to be output by said amplifying portion corresponding to the average amplitude data and second means for obtaining information of a transmission power that is actually output by said amplifying portion corresponding to the average transmission power data, compares the information of the first means with the information of the second means, obtains the difference thereof, outputs the control signal for minimizing the difference, and controls said variable ATT.

6. The gain compensating apparatus as set forth in claim 1, wherein said spreading/combining portion comprises:
n multiplying devices for multiplying n transmission data by n spread codes generated corresponding to a pseudo noise;
n modulation data generators for converting spread data of said n multiplying devices into modulation data for designating an amplitude at a particular time point of a base band signal; and
an adding device for adding the modulation data of n channels.

7. The gain compensating apparatus as set forth in claim 2, wherein said spreading/combining portion cumulates in a predetermined time period the amplitude data of which the spread spectrum data of the individual transmission channels have been multiplexed and obtains average amplitude data.

8. The gain compensating apparatus as set forth in claim 2, wherein said comparing/controlling portion cumulates the transmission power data received from said A/D converting portion in a predetermined time period and obtains average transmission power data.

9. The gain compensating apparatus as set forth in claim 2, wherein said comparing/controlling portion, having first means for obtaining information of a transmission power to be output by said amplifying portion corresponding to the average amplitude data and second means for obtaining information of a transmission power that is actually output by said amplifying portion corresponding to the average transmission power data, for comparing the information of the first means with the information of the second means, obtaining the difference thereof, outputting the control signal for minimizing the difference, and controlling said variable ATT.

10. The gain compensating apparatus as set forth in claim 6, wherein said spreading/combining portion inputs amplitude data of said adding device, stores the amplitude data, communicates the amplitude data in a time period corresponding to a timer, and calculates the average value of the amplitude value.

* * * * *